(12) United States Patent
Wyatt

(10) Patent No.: US 7,002,358 B2
(45) Date of Patent: Feb. 21, 2006

(54) METHOD AND APPARATUS FOR MEASURING JITTER

(75) Inventor: Perry M. Wyatt, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/732,035

(22) Filed: Dec. 10, 2003

(65) Prior Publication Data

US 2005/0127894 A1    Jun. 16, 2005

(51) Int. Cl.
  *G01R 23/20* (2006.01)
  *G01R 29/26* (2006.01)
(52) U.S. Cl. ............... 324/622; 324/613; 702/69
(58) Field of Classification Search ......... 324/76.77, 324/76.19, 613, 76.46, 76.63, 622, 620; 375/226; 702/69; 714/700; 341/53
See application file for complete search history.

(56) References Cited

U.S. PATENT DOCUMENTS

| | | | | |
|---|---|---|---|---|
| 4,975,634 A | * | 12/1990 | Shohet | 324/76.77 |
| 5,557,196 A | * | 9/1996 | Ujiie | 324/76.77 |
| 5,719,783 A | | 2/1998 | Kerzman et al. | 716/6 |
| 6,075,832 A | * | 6/2000 | Geannopoulos et al. | 375/375 |
| 6,092,027 A | * | 7/2000 | Takai et al. | 702/38 |
| 6,400,129 B1 | * | 6/2002 | Yamaguchi et al. | 324/76.82 |
| 6,441,602 B1 | * | 8/2002 | Eckhardt et al. | 324/76.53 |
| 6,822,588 B1 | * | 11/2004 | Marshall et al. | 341/50 |
| 2003/0215037 A1 | | 11/2003 | Chao et al. | |
| 2004/0061488 A1 | * | 4/2004 | Rosenbaum et al. | 324/76.53 |

FOREIGN PATENT DOCUMENTS

| | | |
|---|---|---|
| JP | 2002 071735 A | 3/2002 |
| WO | WO 03081266 A | 10/2003 |

OTHER PUBLICATIONS

Kuo-Hsing Cheng, et al., "Bist for Clock Jitter Measurements", Proceedings of the 2003 IEEE International Symposium on Circuits and Systems, May 25, 2003, vol. 5, pp. V-577-V580, IEEE, Piscataway, New Jersey, USA.

Institut National De La Propriete Industrielle, cover sheet and Preliminary search report dated Jul. 13, 2005 for counterpart French patent application 0413117 (3 pgs).

* cited by examiner

Primary Examiner—Anjan Deb

(57) ABSTRACT

A method of measuring jitter includes generating a jitter pulse having a width corresponding to an amount of jitter. The jitter pulse is provided to a plurality (M) of latches serially coupled to successively trim the pulse as it propagates through the serially coupled latches. Each latch, $l_i$, provides an output $b_i$ indicative of receipt of an edge of the jitter pulse.

19 Claims, 6 Drawing Sheets

METHOD AND APPARATUS FOR MEASURING JITTER

BACKGROUND

Integrated circuits are typically very complex and require numerous iterations of design and verification at different levels of abstraction. The levels of abstraction can be differentiated by the environmental influences and physical implementation details modeled.

Some environmental influences may create timing anomalies that affect the timing of received signals. Even if accurate circuit models are used to account for various elements of delay associated with individual circuit elements, the delays are expected to be deterministic. Other sources of delay may be present in the system. Typical simulators do not account for varying delays in a common clock signal that might be the result of physical phenomenon such as jitter.

Jitter can have deterministic as well as non-deterministic effects on a clock. Jitter can vary across the integrated circuit such that the change in the received clock is different at distinct physical locations. This variation in the clock can create race conditions resulting in unexpected logical behavior. Such race conditions are detrimental to the planned operation of the integrated circuit.

Despite attempts to minimize the effects of jitter during the design phase, some physical embodiments of the integrated circuit may suffer from an unacceptable amount of jitter. Testing may be performed on the integrated circuit to determine whether the integrated circuit is behaving as expected and whether any unexpected behavior is the result of jitter. In view of the size and complexity of modern integrated circuits, however, such testing may be impractical for quick verification.

SUMMARY

In view of limitations of known systems and methods, various methods and apparatus for measuring jitter are described.

One method of measuring jitter includes generating a jitter pulse having a width corresponding to an amount of jitter. The jitter pulse is provided to a plurality (M) of latches serially coupled to successively trim the pulse as it propagates through the serially coupled latches. Each latch, $l_i$, provides an output $b_i$ indicative of receipt of an edge of the jitter pulse.

A jitter measurement apparatus includes a phase/frequency detector providing a pulse having a pulse width corresponding to an amount of jitter in a dock signal. The apparatus includes a plurality (M) of serially coupled latches, wherein each latch propagates a trimmed pulse having a shorter pulse width than a received pulse, wherein each latch $l_i$ provides an output $b_i$ indicative of receipt of an edge of any received pulse.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Phenomena such as jitter can inconsistently modify a clock along the clock signal path so clock edge transitions received by different circuit elements can lead or lag the intended clock edge transition of the common clock for any given clock cycle. The modification can also change unpredictably across clock cycles. Jitter in the clock signal is the deviation from the ideal or intended timing of the event (e.g., location of edge transitions). Jitter is composed of both deterministic and non-deterministic (i.e., random) content.

Deterministic jitter is bound in amplitude and has a traceable cause. Classes of deterministic jitter include duty cycle distortion, data dependent, sinusoidal, and uncorrelated bounded. Clock signals are susceptible to duty cycle distortion and periodic jitter. Deterministic jitter is typically caused by cross talk, simultaneously switched inputs/outputs (resulting in current/voltage spikes and changes in detection thresholds), electromagnetic interference, or recurring signal patterns.

Non-deterministic jitter is stochastic in nature. This random jitter is unbounded. Sources of random jitter include material imperfections, thermal vibration of semiconductor crystal structures, radiation, and other sources. Generally, the term "jitter" refers collectively to both deterministic and non-deterministic jitter.

Figure 1:
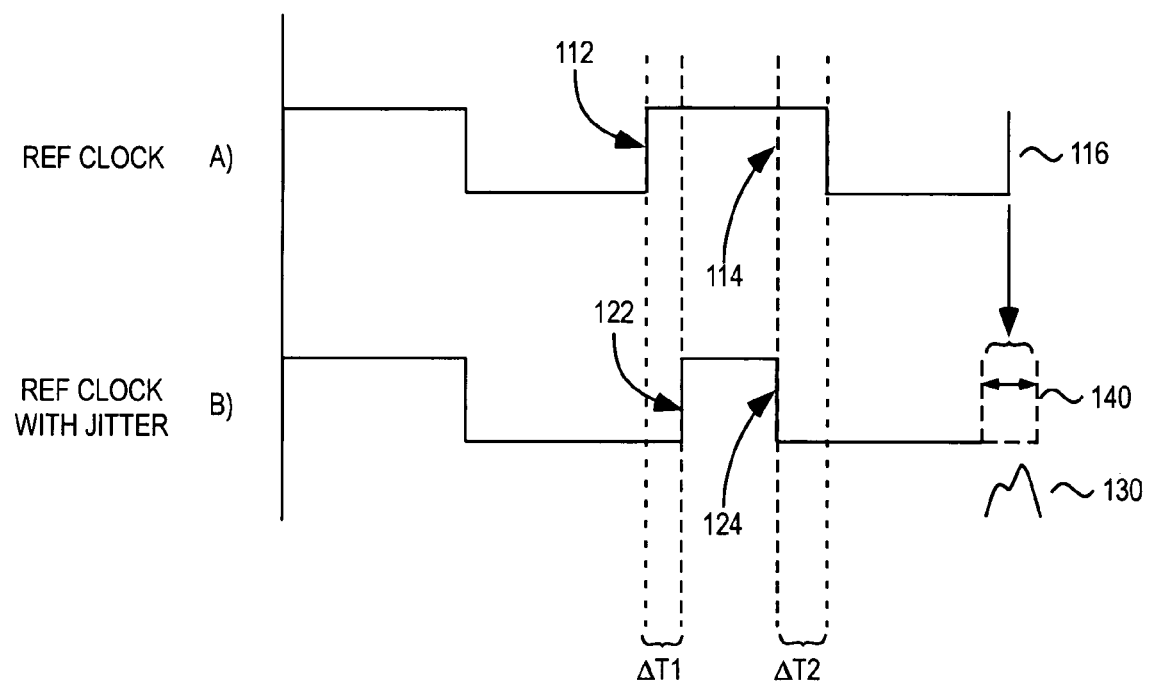
FIG. 1 illustrates the effect of jitter on a clock signal.

FIG. 1 illustrates a reference clock (waveform A) and one embodiment of the reference clock with jitter (waveform B). One result of jitter is the displacement of the clock edge transitions from their ideal locations. Thus jitter can cause clock edges to lead or lag their ideal locations for any given transition such that the jittered clock edge leads the ideal location on one transition and lags the ideal location on another transition.

For example, jittered clock edge 122 lags reference clock edge 112 by a displacement ΔT1. Jittered clock edge 124 leads reference clock edge 114 by a displacement ΔT2. Generally, for a given clock edge location 116, the jittered clock edge will occur in a region 140 near the corresponding reference clock edge location. For any given clock cycle, the jittered clock edge location bears a statistical relationship to the ideal location (i.e., the corresponding reference clock edge transition) as indicated by probability distribution function 130.

A skewed clock generally refers to a clock having a fixed clock edge displacement (e.g., leading or all lagging by the same displacement every cycle) from a corresponding edge of the reference clock such that the skewed clock is a time-shifted version of the reference clock. The skewed clock duty cycle is the same as that of the reference clock. Unlike a skewed clock, the edge displacement of a jittered clock is not constant and can vary every cycle of the clock effectively varying the duty cycle of the clock.

When jitter causes a clock edge to shift substantially relative to logic gate hold or setup times, the result may be a logical anomaly. Even worse, jitter can cause circuitry to generate incorrect results in an inconsistent manner. Knowledge that the jitter exceeds a pre-determined threshold may be useful for isolating the source of logic anomalies or even replacing or otherwise discarding the jitter-prone integrated circuit.

Figure 2:
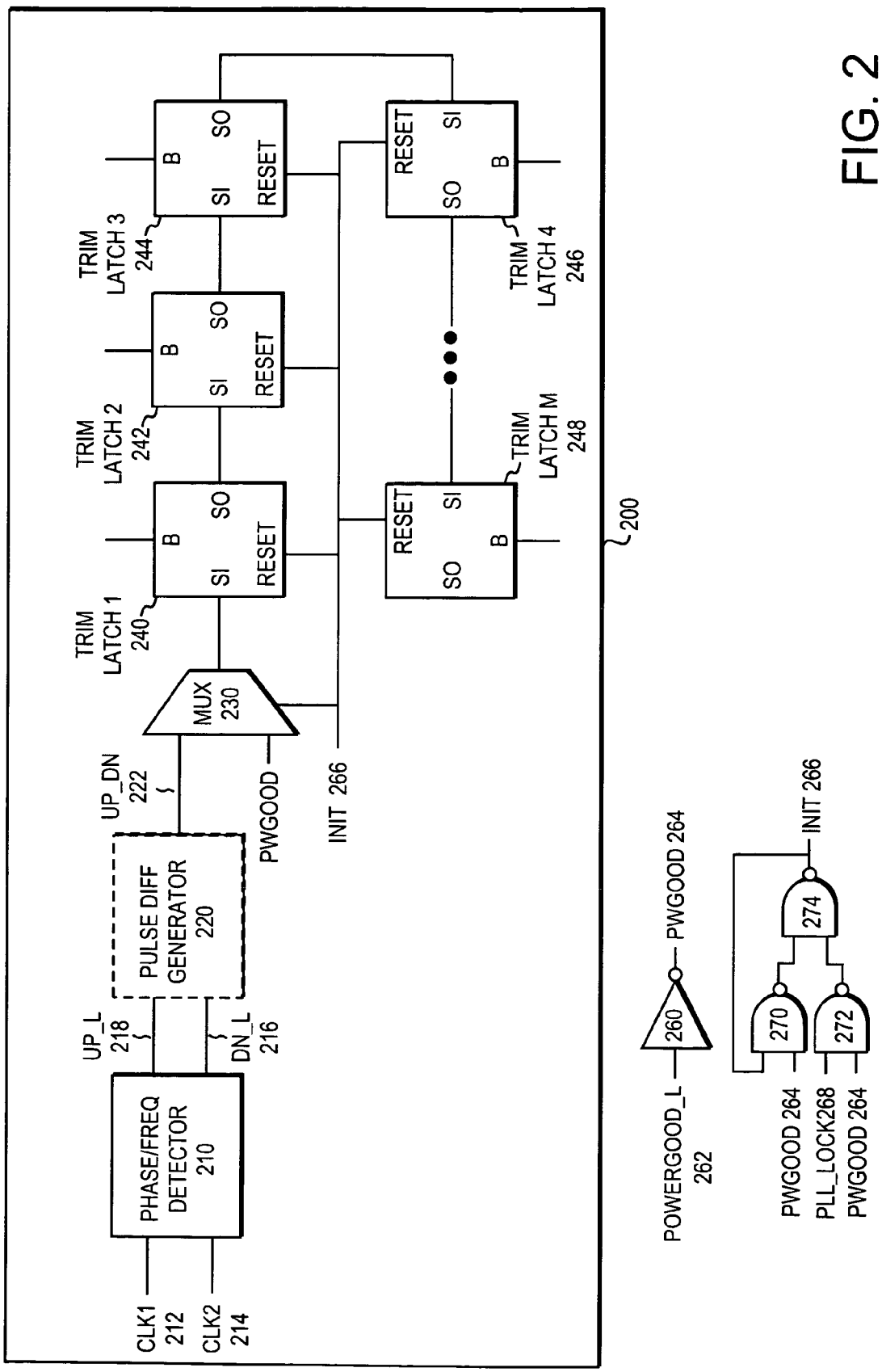
FIG. 2 illustrates one embodiment of jitter measurement circuitry.

FIG. 2 illustrates one embodiment of a jitter measurement circuit. In one embodiment, the jitter measurement circuit is incorporated into an integrated circuit such that the phase/frequency detector 210, pulse difference generator 220, multiplexer 230, and latches 240–248 reside on the same integrated circuit die 200. Logic 260–274 similarly resides on the same integrated circuit die 200. In one embodiment, integrated circuit die is fabricated as a complementary metal oxide semiconductor (CMOS) integrated circuit.

Phase/frequency detector 210 senses phase or frequency differences between two clock signals, CLK1 212 and CLK2 214. The DN_L 216 and UP_L 218 signals are pulse trains where the pulse widths vary depending upon the relationship between clock edges of the CLK1 and CLK2 signals.

A pulse difference generator provides an UP_DN 222 signal corresponding to the magnitude of any phase or frequency difference between the UP_L and DN_L signals. UP_DN 222 is provided to a plurality of M series-coupled latches 240–248. Each latch is a sticky-bit latch. Once set, the latch remains in the set state until reset regardless of any variation in UP_DN.

Figure 3:
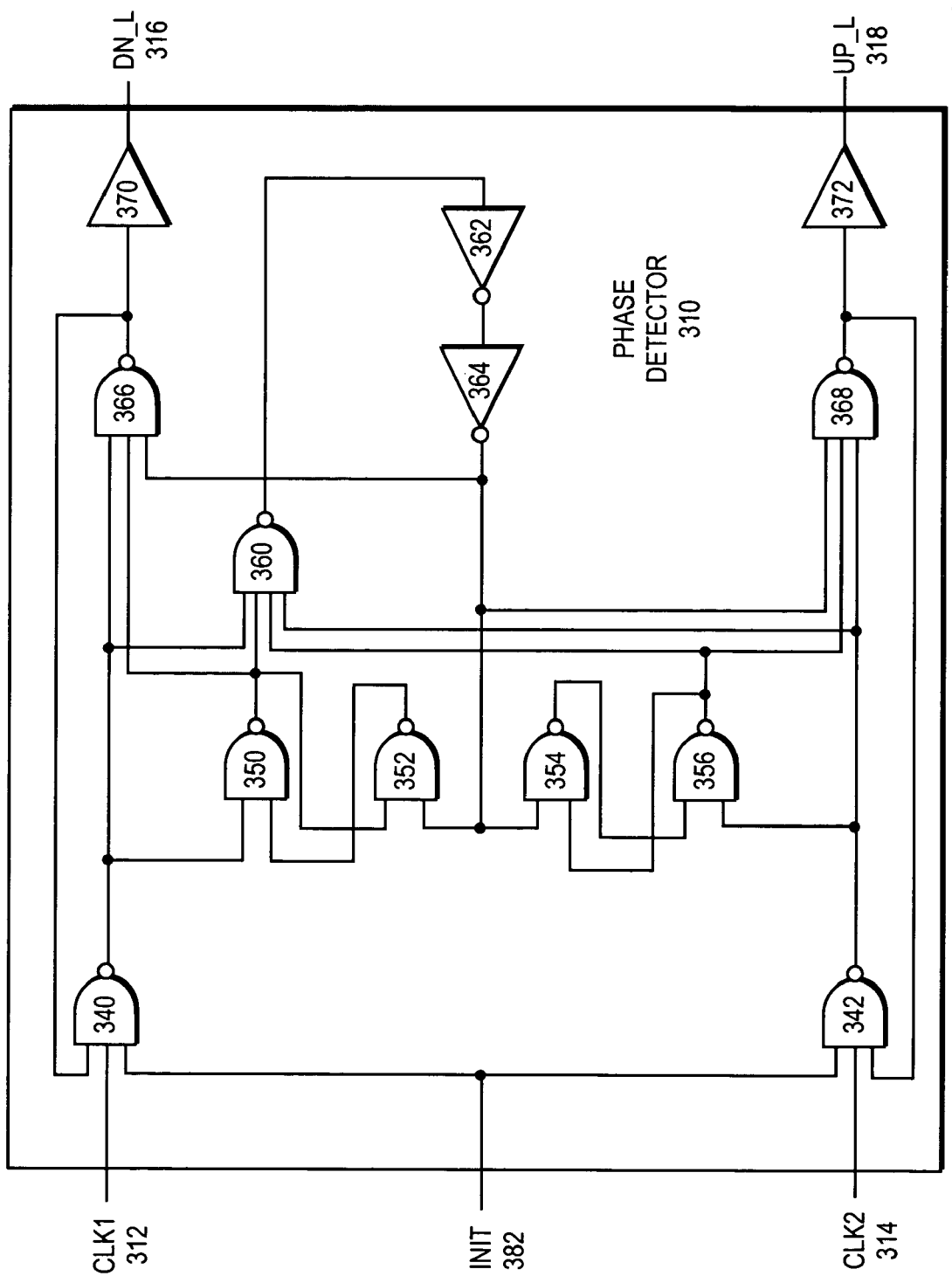
FIG. 3 illustrates one embodiment of a phase/frequency detector.

FIG. 3 illustrates one embodiment of the phase/frequency detector. Phase/frequency detector 310 compares CLK1 312 and CLK2 314. In the illustrated embodiment, phase/frequency detector 310 is based on a NAND gate architecture. NAND gates 350, 352 and 354, 356 form latch pairs. A feedback loop formed by NAND gate 360 and inverters 362, 364 perform a reset function for generating the pulse trains. The UP_L 318 and DN_L 316 signals are driven through buffers 370 and 372. In alternative embodiments, the phase/frequency detector may be based on a NOR gate or other architecture.

The phase/frequency detector generates pulse trains for each of the UP_L and DN_L outputs. The pulses of UP_L and DN_L have a leading edge generated substantially simultaneously. The trailing edges of each pulse UP_L and DN_L, however, may vary as a result of non-aligned clock edges in the two clock signals CLK1, CLK2. Thus differences in the pulse trains of the UP_L and DN_L signals are indicative of non-aligned clock edges. The difference may be indicative of jitter depending upon the source for CLK1 and CLK2.

Referring back to FIG. 2, pulse difference generator 220 may be considered to be part of the phase/frequency detector. The output of phase/frequency detector 210 is effectively a differential signal. Knowledge about both UP_L and DN_L is required to determine which clock edge leads or lags the other clock edge and by how much. Although the amount of any lead or lag may be important for some applications, knowledge of which clock leads or lags the other clock in any particular cycle is irrelevant for jitter determination. The UP_DN 222 signal generated by pulse difference detector 220 is a "jitter pulse" having a width corresponding to the absolute value of the difference between the UP_L and DN_L pulse widths.

Initialization circuitry is provided to provide for resetting or otherwise initializing the latches. Multiplexer 230 selects one of the PWGOOD or the UP_DN signals in accordance with an INIT signal. In the illustrated embodiment, the initialization circuitry is designed to initialize the latches upon power up. When INIT is low, the PWGOOD signal is selected. When INIT is high, the UP_DN signal is selected. The selected signal is provided to a RESET input on each of the latches. One embodiment of the latch architecture is shown in greater detail in FIG. 4.

INIT is low for a short time upon power up, after which INIT transitions to a high level. Thus multiplexer 230 provides the PWGOOD signal (which is low at this time) to the plurality of series-coupled sticky latches. Once power is confirmed, PWGOOD_L transitions to a low state and PWGOOD correspondingly transitions to a high state. INIT transitions from its initial low level to a high level in response to the PWGOOD signal transition. Once INIT transitions high, the circuitry including NAND gates 270, 272, and 274 ensures that INIT remains in the high state until another power up. In particular, the INIT signal is provided as feedback to the NAND gates to ensure that the INIT signal is latched in the high state.

Each of the latches provides a one bit output, b. In response to the INIT signal, each of the latches is reset to a low state such that b=0 for every latch. After initialization, the multiplexer applies the conditioned pulse to the M serially-coupled latches.

The jitter pulse is applied to the signal in (SI) input of the first latch 240. The first latch trims a pre-determined amount from the received jitter pulse to form a modified pulse at the signal out (SO) output of the first latch. The SI input of each successive latch is coupled to the SO output of the previous latch.

Each selected latch, $l_i$, trims its received pulse having a pulse width $r_i$ by a pre-determined amount $d_i$, wherein the selected latch provides a corresponding output pulse of width $o_i = r_i - d_i$ when $r_i > d_i$. The selected latch provides no output pulse when $r_i \leq d_i$. In response to the rising edge of any received pulse, the selected latch will set its output, $b_i$. In an alternative embodiment, the selected latch sets its output in response to the falling edge of any received pulse. Once set, the selected latch output will remain set until initialized. The jitter measurement circuitry provides a thermometer-coded value ($b_M \ldots b_2 b_1$) corresponding to the maximum amount of jitter that has occurred since the last initialization.

Given a pulse of pulse width P provided by the pulse difference generator circuitry, the maximum jitter encountered can be determined by identifying the last latch ($l_k$) proceeding from 1 ... M that has its output set such that $$b_j = \begin{cases} 0, & j > k \\ 1, & j \leq k \end{cases}$$

Given the discrete nature of the delays, the highest set bit, $b_k$, implies $$\sum_{i=1}^{k-1} d_i < P \leq \sum_{i=1}^{k} d_i.$$

Given that $b_i = 0 \; \forall i > k$, we have $$\sum_{i=1}^{k} d_i = \sum_{i=1}^{M} b_i d_i$$

If the delay contributed by each of the latches is substantially the same (i.e., $d = d_i = d_j \forall i, j \in \{1, 2, \ldots M\}$), then $$\sum_{i=1}^{M} b_i d_i = d \sum_{i=1}^{M} b_i = dk$$

Figure 4:
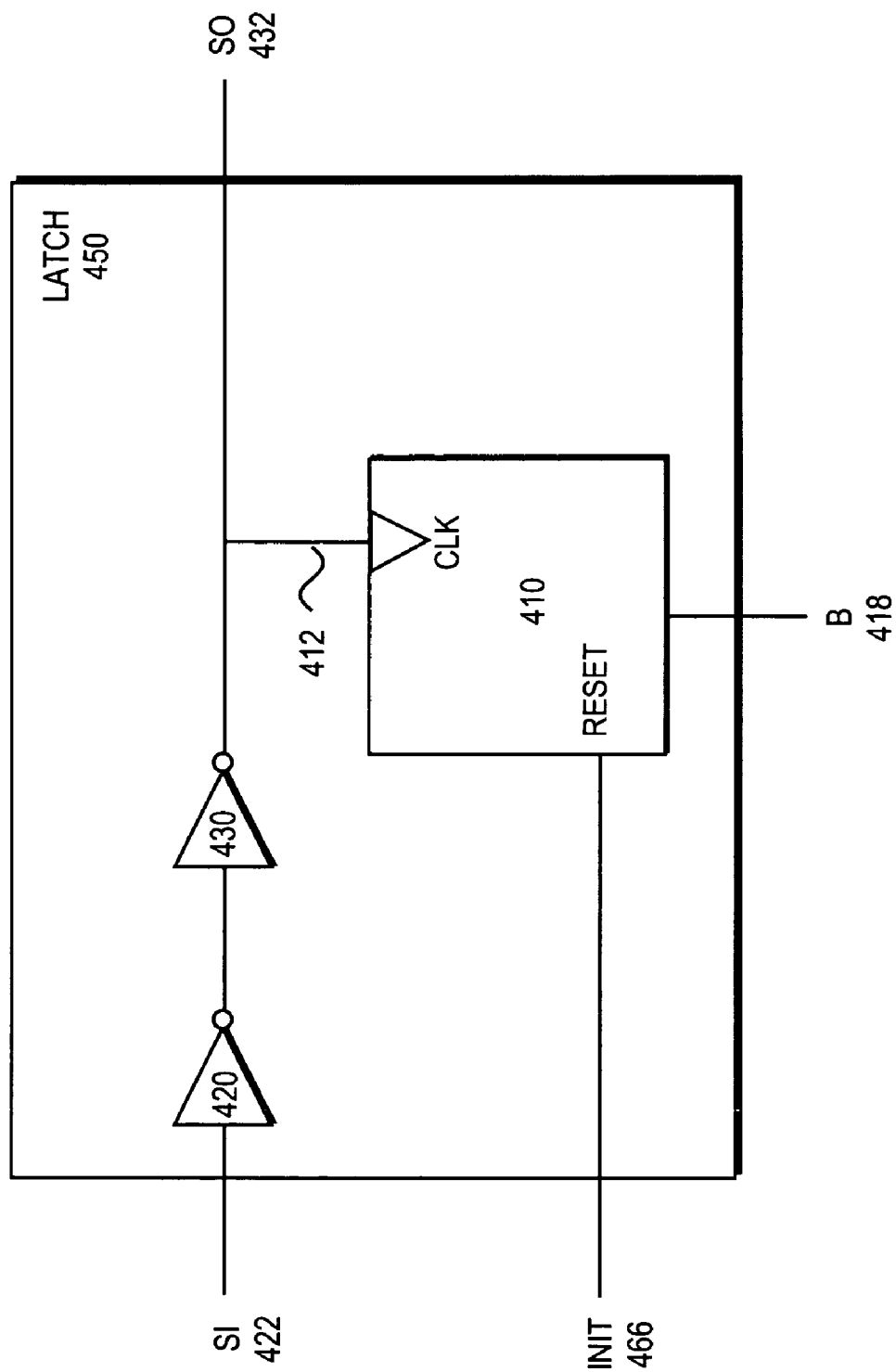
FIG. 4 illustrates one embodiment of a latch.

FIG. 4 illustrates one embodiment of latch circuit 450 suitable for the jitter measurement circuitry of FIG. 2. The signal provided on signal out (SO 432) is delayed from the signal appearing at the signal input (SI 422) by inverters 420 and 430. The inverters are sized to skew the leading edge of the pulse more than the falling edge and thus reduce the pulse width provided to SO 432. In one embodiment, each inverter contributes a delay of approximately 12.5 ps (picoseconds). The delayed signal in 412 is provided to the clock input of latch 410. In one embodiment, latch 410 is a D flip-flop with its data input tied high internally and the INIT 466 signal applied to the flip-flop reset input. The INIT 466 signal serves to reset latch 410 (and thus latch 450) during initialization.

The configuration of latch 410 ensures that latch 450 is a delay latch with a "sticky bit", b 418. Once b is set, it will remain set until latch 410 is reset or initialized. Accordingly, upon an edge transition of SI 422, latch 450 delays the input signal for successive devices serially coupled to its SO 432 output and sets b.

A nominal pulse width may be expected for the jitter measurement circuitry even in the absence of any significant jitter. The jitter measurement circuitry thus "biases" the jitter measurement with an offset attributable to the jitter measurement circuitry itself. In one embodiment, one or more latches are dedicated to eliminating the offset attributable to the method of measuring the jitter.

Referring to FIG. 2, for example, latches 240 and 242 might be used to eliminate the bias contributed to the jitter measurement by the jitter measurement circuitry. In such a case, any such latches may be referred to as offset latches. Thus although the thermometer-coded value $b_M \ldots b_2 b_1$ is representative of the jitter, bit $b_1$ associated with latch 240 and $b_2$ associated with latch 242 might always be set because of the bias included in the jitter measurement.

In one embodiment, the first n latches are dedicated to eliminating the offset such that the $b_M \ldots b_{n+1}$ available for sensing are indicative of the jitter measurement without any bias. Regardless of whether the jitter measurement includes or excludes bias attributable to the method and apparatus for measuring the jitter, a sensed value greater than a predetermined threshold indicates that the amount of jitter is unacceptable for proper integrated circuit operation.

A phase locked loop (PLL) is typically used to generate one clock from a reference clock. Although the clocks may be of different frequencies, the clock edges of the lower frequency clock are edge-aligned with the clock edges of the higher frequency clock due to synchronization provided by the PLL. In one embodiment, the phase/frequency detector of FIGS. 2–3 is provided with the reference clock and the signal from a feedback path of the PLL in order to measure jitter.

Figure 5:
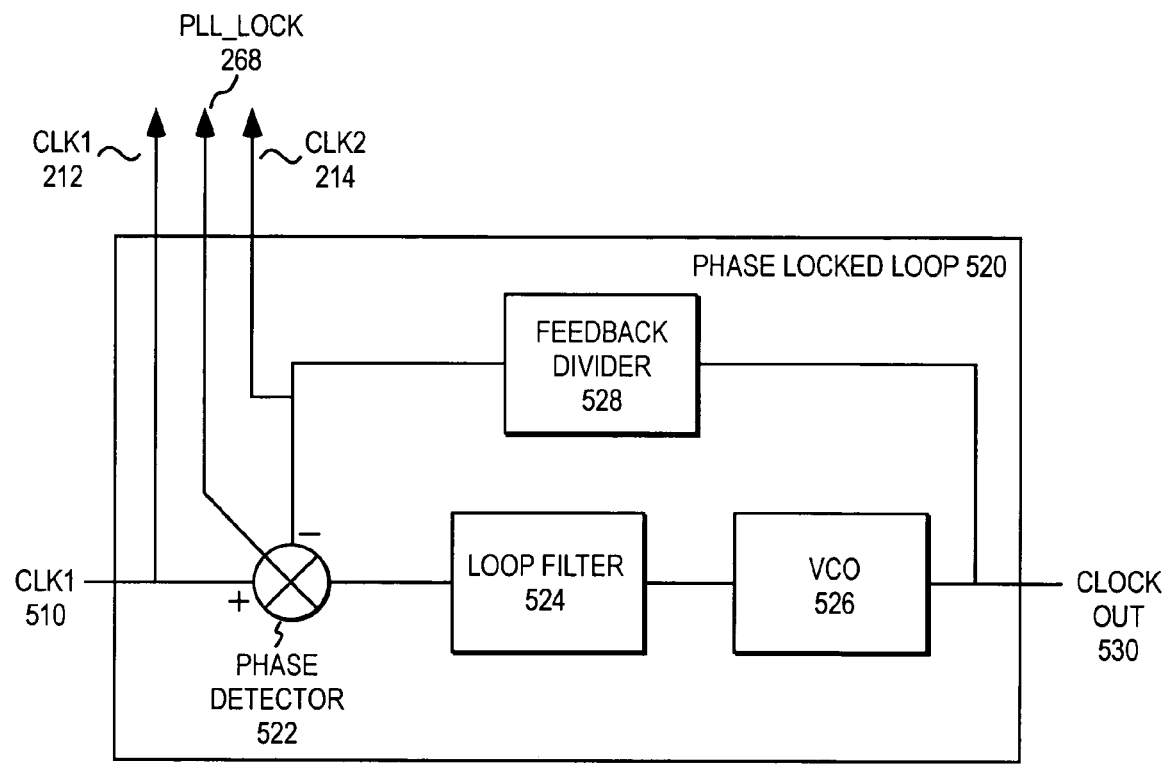
FIG. 5 illustrates one embodiment of a phase locked loop circuit.

FIG. 5 illustrates one embodiment of a typical PLL 520. PLL 520 includes a phase detector 522, a loop filter 524, a voltage controlled oscillator, and a feedback loop 529 that may include a feedback divider 528 for generating a CLOCK OUT 530 that is a fraction of the reference clock, CLK1 510. The input reference clock, CLK1 510 is provided as CLK1 212 in FIG. 1. CLK2 214 of FIG. 2 is taken from the feedback loop 529 after any feedback elements.

PLL 520 also provides a phased loop locked signal, PLL_LOCK 268 that is low until phase detector 522 determines that the phase/frequency difference between CLK1 510 and CLK2 214 is less than a lock threshold. In such a case, the PLL_LOCK 268 signal transitions high to indicate that CLK1 and CLK2 are synchronized. The PLL_LOCK 268 signal is used in FIG. 2 to generate the INIT 266 signal.

Figure 6:
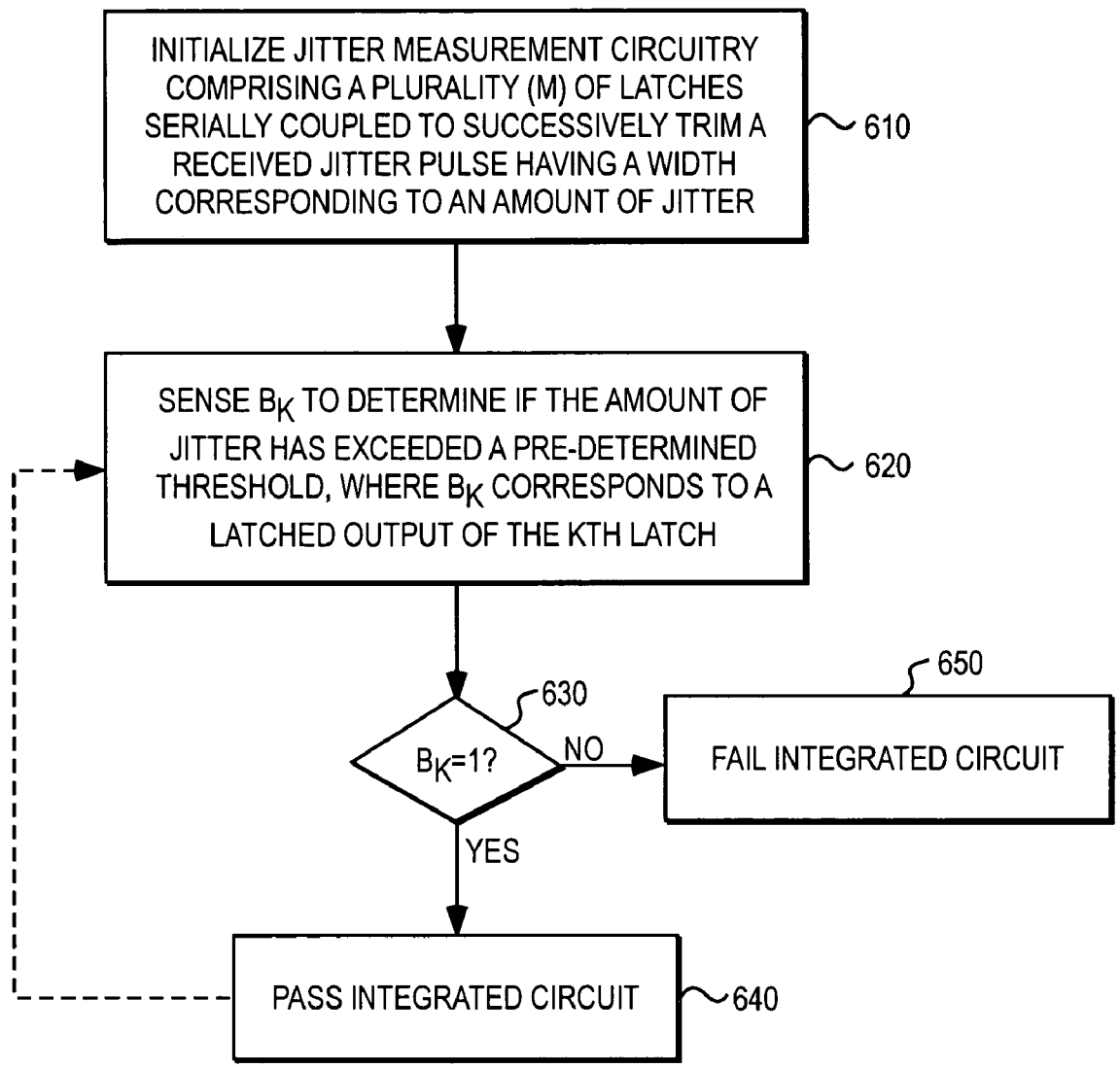
FIG. 6 illustrates one embodiment of a method for measuring jitter.

FIG. 6 illustrates one embodiment of a method for measuring jitter. In step 610, the integrated circuit jitter measurement circuitry is initialized. The jitter measurement circuitry comprises a plurality M of serially-coupled latches coupled to successively trim a received jitter pulse having a width corresponding to an amount of jitter in the integrated circuit. Each latch provides an output b indicative of receipt of a pulse edge.

In step 620, the output of the $k^{th}$ latch (i.e., $b_k$) is sensed to determine whether the amount of jitter has exceeded a pre-determined threshold. $b_k$ is the latched output of the $k^{th}$ latch. The choice of k is dependent upon the amount of delay attributable to each latch and the amount of jitter that the integrated circuit is designed or expected to withstand.

In one embodiment, the latched output of each of the latches (i.e., $b_M \ldots b_2 b_1$) is sensed in order to determine the maximum jitter encountered. If $b_k=1$ as determined by step 630, then the amount of jitter encountered has exceeded the predetermined threshold associated with $b_k$ and the integrated circuit is treated as "failed" in step 650. The failure may be signaled, for example, by sending a signal, setting a failure bit, or shutting down the integrated circuit in various embodiments.

If $b_k=0$, then the integrated circuit is presumably operating within acceptable jitter tolerances. Thus the integrated circuit is treated as "passed" in step 640. In one embodiment, jitter measurement is performed primarily for quality control purposes to ensure that integrated circuits with unacceptable levels of jitter do not enter distribution channels. In other contexts, however, ongoing jitter measurement is desired. Thus steps 620–640 may be performed after initialization and repeated continuously during operation of the integrated circuit in order to ensure integrity of the integrated circuit in an operational environment.

Various modifications and changes may be made thereto without departing from the broader spirit and scope of the invention as set forth in the claims. The specification and drawings are, accordingly, to be regarded in an illustrative rather than a restrictive sense.

What is claimed is:

1. A method of measuring jitter, comprising:
    generating a jitter pulse having a width corresponding to an amount of jitter; and
    providing the jitter pulse to a first latch of a plurality (M) of latches serially coupled to successively trim the pulse as it propagates through the serially coupled latches, wherein each latch, $l_i$, provides an output $b_i$ indicative of receipt of an edge of the jitter pulse.

2. The method of claim 1 wherein each selected latch, $l_i$ sets its output, $b_i$ in response to one edge of any received pulse, wherein the selected latch trims its received pulse having pulse width $r_i$ by a pre-determined amount $d_i$, wherein the selected latch provides a corresponding output pulse of width $o_i = r_i - d_i$ when $r_i > d_i$ and no output pulse when $r_i \leq d_i$.

3. The method of claim 2 wherein the $d_i$ are substantially identical such that $d_i = d, \forall i, j \in \{1, 2, \ldots M\}$.

4. The method of claim 1 wherein the successive outputs form a thermometer coded value, $b_M \ldots b_1$, representative of the amount of jitter.

5. The method of claim 1 further comprising:
sensing multiple latch outputs to determine the amount of jitter.

6. The method of claim 5 wherein sensing multiple latch outputs further comprises proceeding from the Mth latch toward the first latch to determine the amount of jitter.

7. The method of claim 5 wherein sensing multiple latch outputs further comprises sensing a $k^{th}$ latch to determine if the amount of jitter exceeds a pre-determined threshold, wherein $1 \leq k \leq M$.

8. The method of claim 1 wherein generating the jitter pulse and providing the jitter pulse are performed by integrated circuitry residing on an integrated circuit die.

9. A jitter measurement apparatus comprising:
a phase/frequency detector apparatus providing a jitter pulse having a pulse width corresponding to an amount of jitter in a clock signal; and
a plurality (M) of serially coupled latches at least one receiving the jitter pulse, wherein each latch $l_i$ propagates a trimmed pulse having a shorter pulse width than its received pulse, wherein each latch $l_i$ provides an output $b_i$ indicative of receipt of an edge of any pulse received by that latch.

10. The apparatus of claim 9 wherein each selected latch, $l_i$ sets its output, $b_i$ in response to one edge of any received pulse, wherein the selected latch trims its received pulse having pulse width $r_i$ by a pre-determined amount $d_i$, wherein the selected latch provides a corresponding output pulse of width $o_i = r_i - d_i$ when $r_i > d_i$ and no output pulse when $r_i \leq d_i$.

11. The apparatus of claim 10 wherein the $d_i$ are substantially identical such that $d_i = d_j \forall i, j \in \{1, 2, \ldots M\}$.

12. The apparatus of claim 9 wherein the successive $b_i$ outputs form a thermometer-coded value, $b_M \ldots b_1$, representative of the amount of jitter.

13. The apparatus of claim 9 wherein the phase/frequency detector apparatus and the plurality of latches reside on a same integrated circuit die.

14. The apparatus of claim 9 further comprising:
a phase locked loop for generating a clock from a reference clock CLK1, wherein a feedback loop of the phase locked loop provides a clock signals CLK2, wherein the phase/frequency detector apparatus is coupled to provide a signal corresponding to an edge alignment difference between CLK1 and CLK2.

15. The apparatus of claim 9 wherein the phase/frequency detector apparatus comprises:
a phase/frequency detector providing first and second pulse trains, wherein a relative difference between the first and second pulse trains indicates which of a first clock, CLK1 and a second clock CLK2 leads the other; and
a pulse difference generator providing the jitter pulse, wherein the width of the jitter pulse corresponds to a magnitude of the difference in alignment between CLK1 and CLK2.

16. The apparatus of claim 9 wherein each latch $l_i$ further comprises:
a plurality of inverters coupled to provide the trimmed pulse from the received pulse; and
a flip-flop having a clock input coupled to receive the trimmed pulse, wherein an output of the flip-flop corresponds to output $b_i$.

17. The apparatus of claim 16 wherein the plurality of inverters comprises first and second serially-coupled inverters, wherein the first and second inverters are sized to skew a leading edge of the received pulse more than a falling edge of the received pulse.

18. The apparatus of claim 9 wherein the phase/frequency detector apparatus and the plurality of serially-coupled latches reside on an integrated circuit die.

19. The apparatus of claim 17 wherein the integrated circuit die is a complementary metal oxide semiconductor (CMOS) integrated circuit die.

* * * * *